(12) United States Patent
Shetty et al.

(10) Patent No.: US 8,149,152 B2
(45) Date of Patent: Apr. 3, 2012

(54) CAPACITOR BASED DIGITAL TO ANALOG CONVERTER LAYOUT DESIGN FOR HIGH SPEED ANALOG TO DIGITAL CONVERTER

(75) Inventors: Venkatesh Teeka Srinivasa Shetty, Bangalore (IN); Govind Kulkarni, Hubli (IN); Srinivasan Chakravarthy, Bangalore (IN); Sumeet Mathur, Bangalore (IN)

(73) Assignee: Cosmic Circuits Private Limited, Bangalore, Karnataka (IN)

( * ) Notice: Subject to any disclaimer, the term of this patent is extended or adjusted under 35 U.S.C. 154(b) by 88 days.

(21) Appl. No.: 12/729,291

(22) Filed: Mar. 23, 2010

(65) Prior Publication Data
US 2010/0253563 A1 Oct. 7, 2010

(51) Int. Cl.
*H03M 1/66* (2006.01)
(52) U.S. Cl. ............................ 341/150; 257/48; 341/144
(58) Field of Classification Search .......... 341/144–155; 257/48
See application file for complete search history.

(56) References Cited

U.S. PATENT DOCUMENTS

| | | | | |
|---|---|---|---|---|
| 5,581,252 A * | 12/1996 | Thomas | ........................ | 341/144 |
| 5,889,486 A * | 3/1999 | Opris et al. | .................... | 341/150 |
| 5,923,024 A * | 7/1999 | Wray | ........................ | 235/462.25 |
| 6,271,784 B1 * | 8/2001 | Lynn et al. | ..................... | 341/150 |
| 6,642,764 B2 * | 11/2003 | Deas et al. | ..................... | 327/205 |
| 7,173,230 B2 * | 2/2007 | Charbon | .................... | 250/214 A |
| 7,615,970 B1 * | 11/2009 | Gimlan | ........................ | 320/166 |
| 7,795,615 B2 * | 9/2010 | Goebel et al. | .................... | 257/48 |

* cited by examiner

*Primary Examiner* — Lam T Mai
(74) *Attorney, Agent, or Firm* — Kanika Radhakrishnan; Evergreen Valley Law Group, P.C.

(57) ABSTRACT

A method and system for capacitor based digital to analog converter design layout for high speed analog to digital converter are provided. The method includes arranging a plurality of metal plates to form the capacitor. Each of the plurality of metal plates includes a driven plate and a common plate. The method also includes generating a plurality of interconnects in the common plate and extending the driven plate over the plurality of interconnects. Further, the method includes shielding the common plate by the driven plate. The system includes an analog to digital converter. The analog to digital converter also includes capacitor based digital to analog converter and digital logic for controlling digital operations in the analog to digital converter. The capacitor based digital to analog converter includes a plurality of capacitors, and a comparator for comparing the analog output from the digital to analog converter with a ground potential.

20 Claims, 5 Drawing Sheets

CAPACITOR BASED DIGITAL TO ANALOG CONVERTER LAYOUT DESIGN FOR HIGH SPEED ANALOG TO DIGITAL CONVERTER

FIELD

The present disclosure relates generally to the layout of capacitors and more particularly to the field of a capacitor based digital to analog converter layout design for high speed analog to digital converter.

BACKGROUND

Analog signals and digital signals are an integral part of electronics circuits. A wide range of electronic circuits utilizes one or both the signals. Often, in circuits, these signals need to be converted from one form to another and hence an analog to digital converter (ADC) and a digital to analog converter (DAC) are employed in circuits. Multiple techniques exist for implementing analog to digital conversion, for example, direct conversion or flash type ADC, successive approximation type ADC, ramp-compare ADC, etc. Typically, the DAC is implemented using R-2R or binary weighted techniques.

Often, ADC's employ a capacitor based DAC for high accurate conversion of digital signal to analog signal. Capacitors are charge sensitive passive components and often develop unwanted capacitance with neighboring terminals. This capacitance formation leads to non-linearity in the circuit operation thereby hampering the circuit operation and its performance.

In light of the foregoing discussion there is a need for an efficient technique for a capacitor based digital to analog converter layout design for high speed analog to digital converter.

SUMMARY

Embodiments of the present disclosure described herein provide a capacitor based digital to analog converter layout design for eliminating parasitic capacitance.

An example of a method for eliminating parasitic capacitance in a capacitor based digital to analog converter (DAC), includes arranging a plurality of metal plates to form the capacitor, wherein each of the plurality of metal plates includes a driven plate and a common plate. The method also includes generating a plurality of interconnects in the common plate. Further, the method includes extending the driven plate over the plurality of interconnects. Moreover, the method includes shielding the common plate by the driven plate.

An example of a system for eliminating parasitic capacitance in a capacitor based digital to analog converter (DAC), includes an analog to digital converter (ADC). The ADC includes a capacitor based DAC. Further, the ADC includes a digital logic for controlling digital operations. The DAC includes a comparator for comparing the analog output from the digital to analog converter with a ground potential. The capacitor based DAC includes a plurality of caged capacitors. Each of the plurality of the caged capacitors includes a common plate and a driven plate, wherein the common plate is covered by the driven plate for eliminating parasitic capacitance.

BRIEF DESCRIPTION OF FIGURES

The accompanying figures, similar reference numerals may refer to identical or functionally similar elements. These reference numerals are used in the detailed description to illustrate various embodiments and to explain various aspects and advantages of the present disclosure.

Persons skilled in the art will appreciate that elements in the figures are illustrated for simplicity and clarity and may have not been drawn to scale. For example, the dimensions of some of the elements in the figures may be exaggerated relative to other elements to help to improve understanding of various embodiments of the present disclosure.

DETAILED DESCRIPTION

It should be observed that method steps and system components have been represented by conventional symbols in the figures, showing only specific details that are relevant for an understanding of the present disclosure. Further, details that may be readily apparent to person ordinarily skilled in the art may not have been disclosed. In the present disclosure, relational terms for example, first and second, and the like, may be used to distinguish one entity from another entity, without necessarily implying any actual relationship or order between such entities.

Embodiments of the present disclosure described herein provide a capacitor based digital to analog converter layout design for high speed analog to digital converter.

Figure 1:
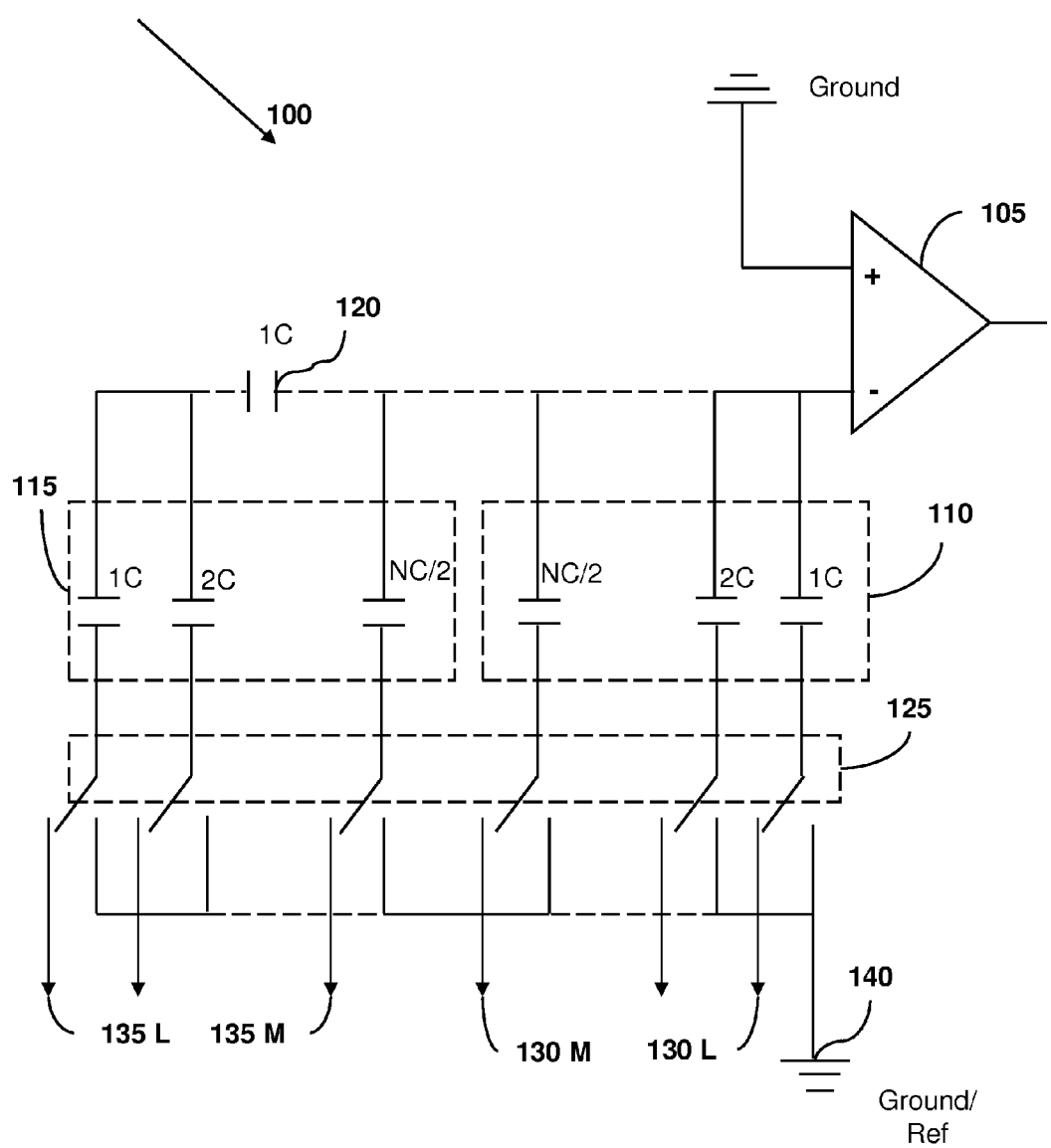
FIG. 1 is a block diagram of a capacitor based digital to analog converter, in accordance with which various embodiments can be implemented.

FIG. 1 is a block diagram of a capacitor based Digital to Analog Converter (DAC) 100, in accordance with which various embodiments can be implemented. The block diagram is a capacitor to capacitor (C2C) based DAC with a coupling capacitor.

The DAC 100 includes a comparator 105, a first capacitor array 110, a second capacitor array 115, a coupling capacitor (Cc) 120, switches 125, and digital inputs 130M, 130L, 135M, and 135L. The digital inputs 130M and 130L are fed to the first capacitor array 110 through the switches 125. The digital input 135M and 135L are fed to the second capacitor array 115 through the switches 125. Further, the first capacitor array 110 and the second capacitor array 115 can be coupled to a ground 140 through the switches 125.

The comparator 105 in accordance with the present disclosure compares the analog output from the DAC 100 with a ground potential. In one embodiment the ground potential can be replaced by a voltage from a reference source.

In one embodiment, the comparator 105 is implemented using an operational amplifier (Op-amp). Inverting terminal of the op-amp is connected to the output from the capacitor array 110 and 115. Further, non inverting terminal of the op-amp is connected to ground potential.

For an N-bit digital input as the bit count increases, capacitance value increases based on the binary weight. For example, in a 10 bit digital input the maximum capacitance required is 1024C and a 16 bit digital input requires a maximum capacitance of 65536C, to avoid such high values of capacitance a 10 bit digital input can be feed as two 5 bit inputs.

In the block diagram 100, N bit digital input is divided into two N/2 digital input and feed to the capacitor arrays 110 and 115. The Cc 120 is used to couple the two digital inputs. The capacitor array 110 and 115 includes capacitors rated from 1C to NC/2, wherein N represents the N'th bit. The capacitance value varies as an exponent of 2.

The digital input 135L represents the Least Significant Bit (LSB), and the digital input 130M represents Most Significant Bit (MSB) for the N bit digital input provided to the capacitor array 110 and 115 respectively. The inputs 135L to 135M represent the first half of the two N/2 digital inputs. Further, the inputs 135L to 135M includes, for example, the first five LSB's that are connected to the Cc 120. The inputs 130M to 130L represent the second half of the two N/2 digital inputs. Further, the inputs 130M to 130L includes, for example, the five MSB's that are connected to virtual ground of the comparator 105.

In the capacitor arrays 110 and 115, the terminal of the capacitor connected to their respective digital inputs are henceforth referred as driven plate, and the other terminals are henceforth referred as common plate. The common plate is interconnected to one or more similar common plates in the capacitor array 110 and 115. Further the Cc 120 terminals are connected to the common plates of the capacitor array 115.

In existing DAC architectures, the Cc 120 capacitor is trimmed to balance out any parasitic capacitances. However, trimming is not cost effective and requires associated testing overheads. Hence, an efficient capacitor based DAC layout design for eliminating parasitic capacitance is provided in the present disclosure. The layout design of the capacitor based DAC for eliminating parasitic capacitances is explained in detail in conjunction with FIG. 2-FIG. 4.

Figure 2:
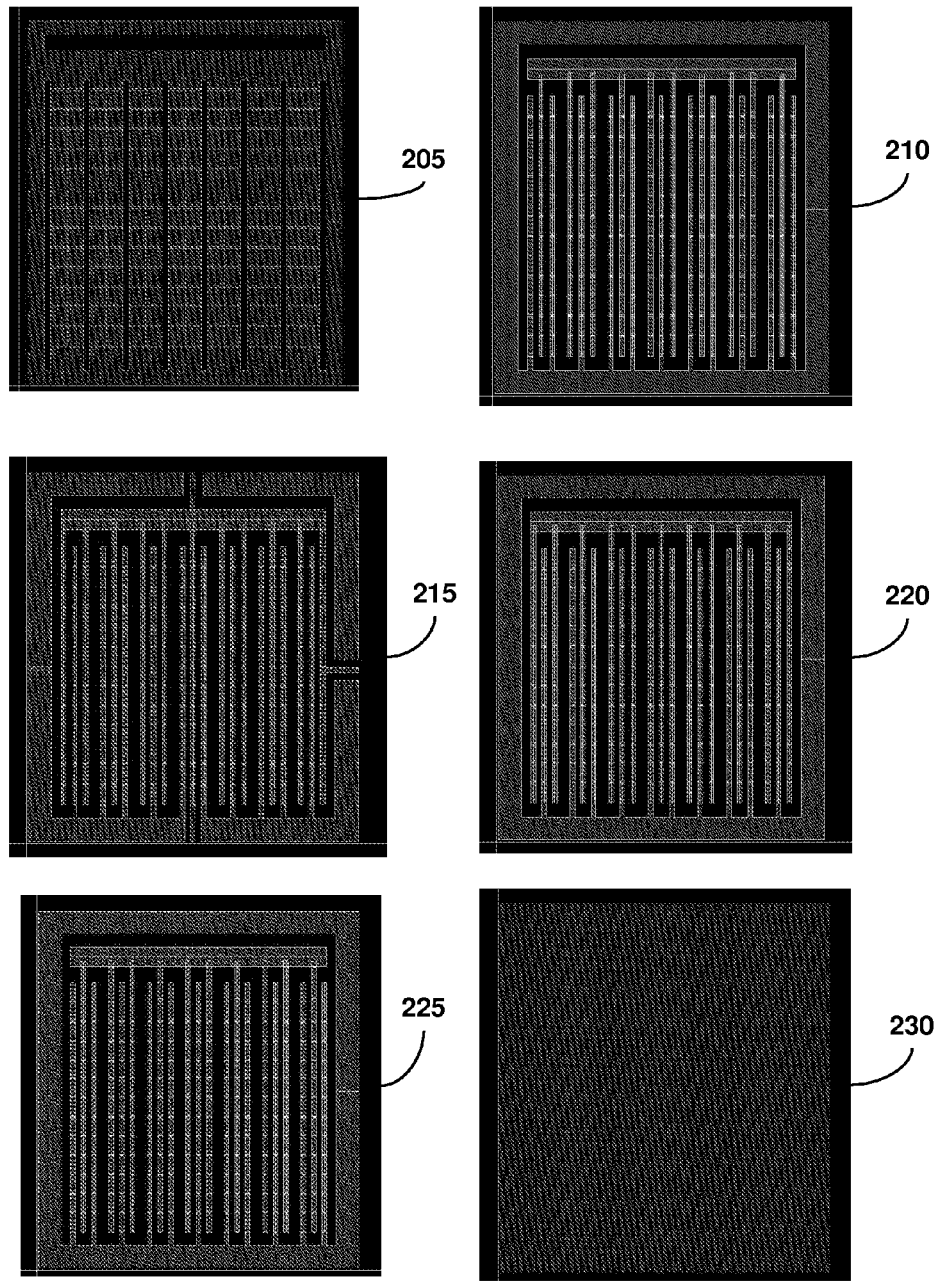
FIG. 2 illustrates metal plates in a capacitor, in accordance with one embodiment.

FIG. 2 illustrates metal plates in a capacitor, in accordance with one embodiment.

According to the present disclosure, six metal plates are stacked one above the other to form the capacitor. The six metal plates are numbered as 205, 210, 215, 220, 225, and 230. The capacitor formed with the six metal plates has the structure of a caged capacitor. In the present caged capacitance structure, each of the metal plates includes a driven plate and a common plate. The driven plate and the common plate of the metal plates are interconnected respectively.

The metal plates 205 and 230 are electrically connected to the driven plates of the one or more metal plates. The metal plates 205 and 230 form top and bottom plates of the caged capacitor respectively. Further, the arrangement of the metal plates 205 and 230 in the caged capacitor eliminates parasitic capacitance.

In one embodiment, the metal plates 205 and 230 form the bottom and top of the capacitor stack respectively.

The metal plates 210, 220 and 225 are structurally the same. The structure of the metal plates 210, 220 and 225 is explained in detail in conjunction with FIG. 3.

The metal plate 215 has one or more opening for interconnection with one or more of the capacitor. The metal plate 215 is explained in detail in conjunction with FIG. 4.

Figure 3:
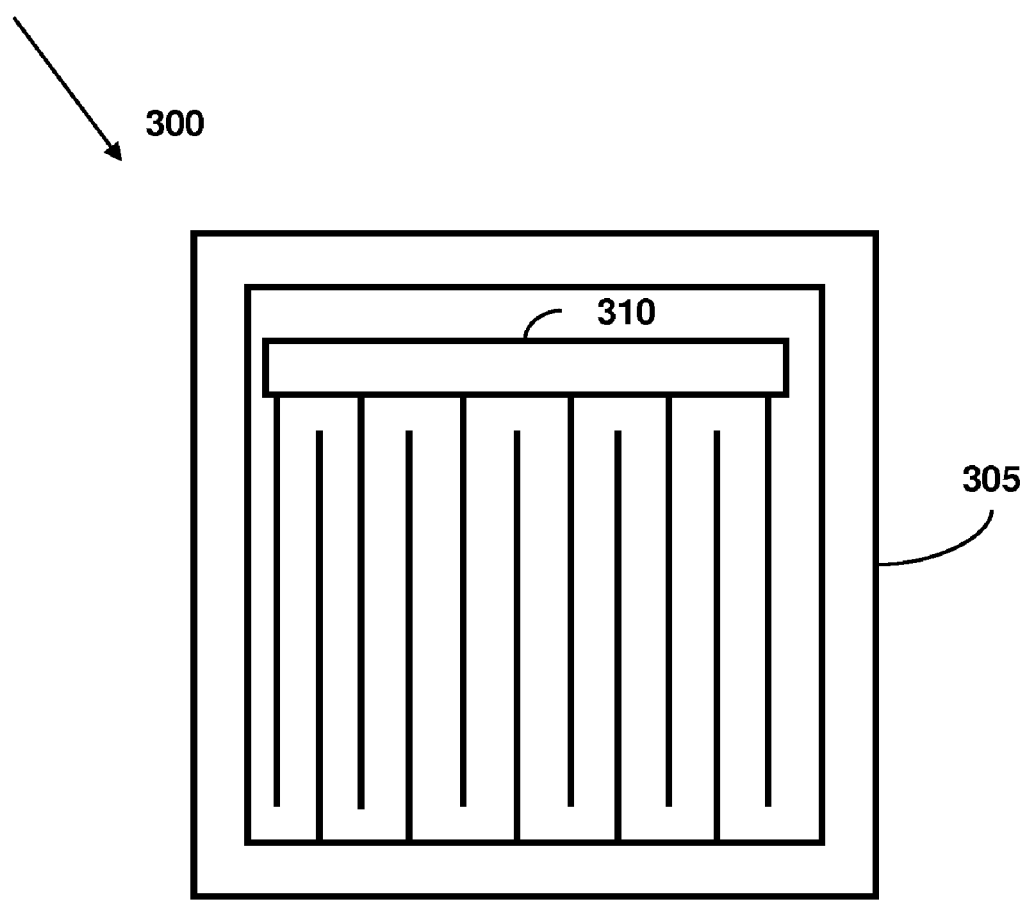
FIG. 3 illustrates a metal plate, in accordance with one embodiment.

FIG. 3 illustrates a metal plate 300, in accordance with one embodiment.

The metal plate 300 is one of the constituent metal plates of a metal stack, wherein the metal stack forms a capacitor. The metal plate further includes a driven plate 305 and a common plate 310.

The driven plate 305 covers the common plate 310. A capacitor is formed between the driven plate 305 and the common plate 310 through the inter-locking of projections that protrude from both the plates 305 and 310. The plates 305 and 310 are electrically connected to one or more metal plates to form the metal stack. Covering the common plate 310 by the driven plate 305 prevents any parasitic capacitance affecting the common plate 310.

Figure 4:
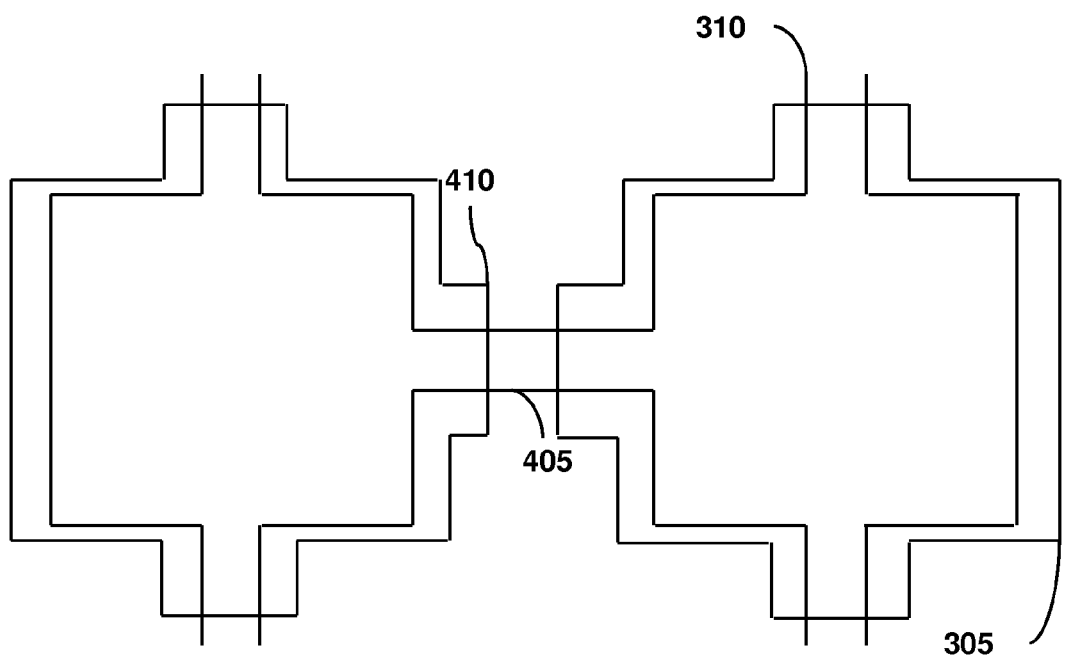
FIG. 4 illustrates interconnection among capacitors, in accordance with one embodiment.

FIG. 4 illustrates interconnection among capacitors, in accordance with one embodiment.

To obtain a higher value of capacitance it is common to interconnect one or more capacitors. Further, from a circuit design point of view it may be necessary to interconnect one or more capacitors. One or more projections protrude from the metal plates as illustrated in the FIG. 4. Theses projections provide interconnections with other capacitors.

A metal plate includes a driven plate 305 and a common plate 310. The driven plate 305 shields the common plate 310.

For the purpose of interconnecting with one or more capacitor a projection is taken out from the common plate 310. The interconnection 405 can be used to establish contact with a neighboring capacitor.

A projection 410 from the driven plate 305 is used to prevent any parasitic capacitance affecting the interconnection 405. The projection 410 extends above and below the interconnection 405.

Figure 5:
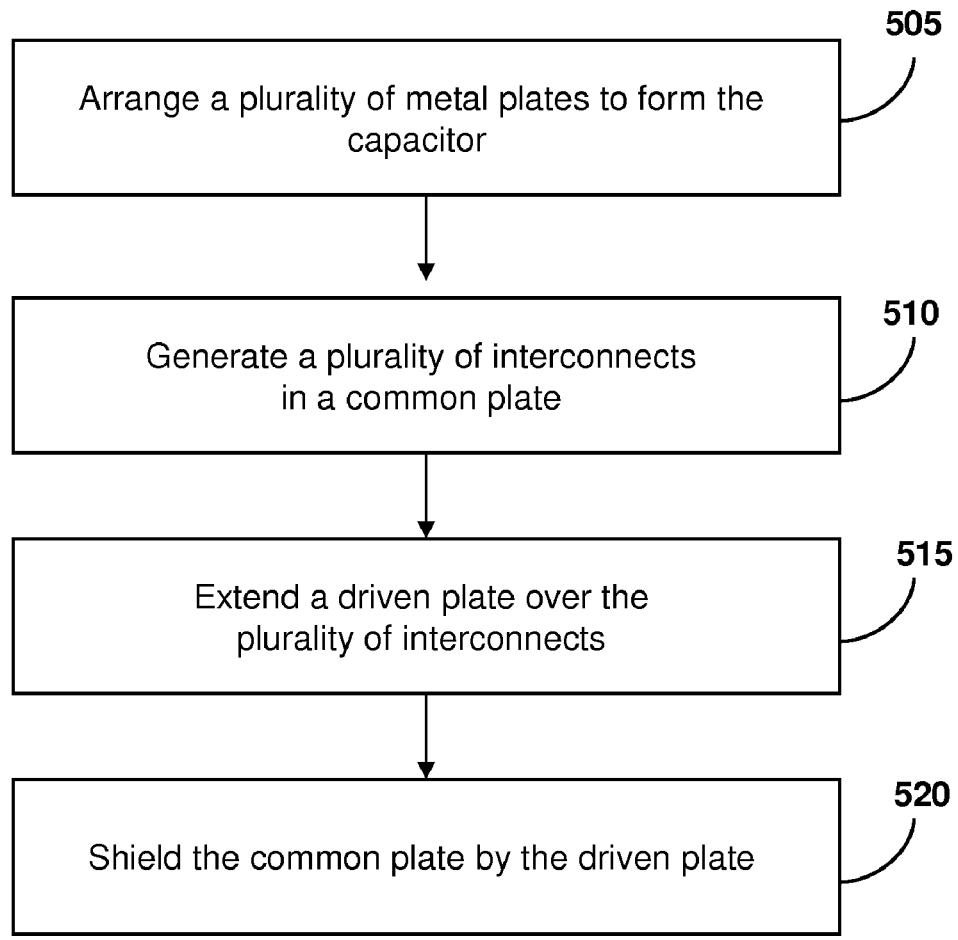
FIG. 5 illustrates a method of eliminating parasitic capacitance in a capacitor based digital to analog converter, in accordance with one embodiment.

FIG. 5 illustrates a method of eliminating parasitic capacitance in a capacitor based digital to analog converter, in accordance with one embodiment.

At step 505, a plurality of metal plates are arranged to form a caged capacitor. Each of the plurality of metal plates includes a driven plate and a common plate. The common plates of the plurality of metal plates are interconnected. Further, the driven plates of the plurality of metal plates are interconnected.

At step 510, a plurality of interconnects are generated in the common plate.

At step 515, the driven plate is extended over the plurality of interconnects. The plurality of interconnects is coupled to one or more caged capacitors. Further, the driven plate is extended over and below the interconnection.

At step 520, the common plate is shielded by the driven plate. The common plate is shielded by the driven plate from any parasitic capacitance.

Shielding of the common plate by the driven plate in the cage capacitor prevents any parasitic capacitance in the capacitor array of the capacitor based DAC. The capacitor based DAC has high resolution and hence can be used in high speed analog to digital converters.

In the preceding specification, the present disclosure and its advantages have been described with reference to specific embodiments. However, it will be apparent to a person ordinary skilled in the art that various modifications and changes can be made, without departing from the scope of the present disclosure, as set forth in the claims below. Accordingly, the specification and figures are to be regarded as illustrative examples of the present disclosure, rather than in restrictive sense. All such possible modifications are intended to be included within the scope of present disclosure.

What is claimed is:

1. A method of eliminating parasitic capacitance in a capacitor based digital to analog converter (DAC), the method comprising:
   arranging a plurality of metal plates, wherein each of the plurality of metal plates comprises a driven plate and a common plate;
   generating a plurality of interconnects in the common plate;
   extending the driven plate over the plurality of interconnects; and
   shielding the common plate by the driven plate.

2. The method of claim 1, wherein the arranging comprises:
for each respective one of the metal plates, forming a respective caged capacitor between the driven plate and the common plate of the respective one of the metal plates; and
interconnecting the driven plates and the common plates of the respective ones of the plurality of metal plates.

3. The method of claim 2, wherein:
the interconnecting the common plates of the respective ones of the plurality of metal plates produces interconnects between the common plates of the respective ones of the plurality of metal plates; and
the method further comprises:
coupling the plurality of interconnects to one or more of the respective caged capacitors.

4. The method of claim 1, wherein the extending is over and below the interconnection.

5. The method of claim 1, wherein:
the arranging includes arranging the plurality of metal plates into a capacitor array; and
the shielding includes preventing parasitic capacitance in the capacitor array of the capacitor based DAC.

6. The method of claim 2, wherein the interconnecting includes:
providing an interconnection for coupling a first plate of a first capacitor to a first plate of a second capacitor; and
providing a projection from a second plate of the first capacitor for preventing parasitic capacitance from affecting the interconnection;
wherein the respective first plates are one of (i) the driven plates, and (ii) the common plates, of the first and second capacitors; and
the second plate is the other of (i) the driven plate, and (ii) the common plate, of the first capacitor.

7. A caged capacitor array comprising:
a plurality of interconnected metal plates, each of the plurality of metal plates having a common plate and a driven plate;
wherein, for each of the plurality of metal plates:
the common plate has a plurality of interconnects;
the driven plate extends over the plurality of interconnects; and
the common plate is shielded by the driven plate.

8. The caged capacitor array of claim 7, wherein the driven plate covers the common plate.

9. The caged capacitor array of claim 7, wherein common pates of the plurality of metal plates are interconnected.

10. The caged capacitor array of claim 7, wherein driven plates of the plurality of metal plates are interconnected.

11. The caged capacitor array of claim 7, wherein, for each of the plurality of metal plates, the driven plate and the common plate have interlocked projections.

12. The caged capacitor array of claim 9, wherein the common plates are interconnected with projections.

13. The caged capacitor array of claim 10, wherein the driven plates are interconnected with projections.

14. A system for eliminating parasitic capacitance in a capacitor based digital to analog converter (DAC), the system comprising:
an analog to digital converter, the analog to digital converter comprising:
the capacitor-based digital to analog converter; and
a digital logic for controlling digital operations in the analog to digital converter;
wherein the capacitor-based digital to analog converter comprises a plurality of metal plates, each of the plurality of metal plates comprising a driven plate and a common plate;
each one of the common plates having a plurality of interconnects in the common plate;
the driven plate being extended over the plurality of interconnects;
wherein the driven plate shields the common plate.

15. The system of claim 14, wherein the capacitor based digital to analog converter comprises a comparator for comparing the analog output from the digital to analog converter with a ground potential.

16. The system of claim 14, wherein the capacitor based digital to analog converter comprises a plurality of caged capacitors.

17. The system of claim 16, wherein each of the plurality of caged capacitors comprises a common plate and a driven plate, wherein the common plate is covered by the driven plate for eliminating parasitic capacitance.

18. The system of claim 17, wherein, for each respective one of the plurality of caged capacitors, the respective driven plate and common plate have interlocked projections.

19. The system of claim 17, wherein the common pates of the plurality of caged capacitors are interconnected.

20. The system of claim 17, wherein the driven plates of the plurality of caged capacitors are interconnected.

* * * * *